US008440906B2

(12) United States Patent
Alivisatos et al.

(10) Patent No.: US 8,440,906 B2
(45) Date of Patent: May 14, 2013

(54) NANOCRYSTAL SOLAR CELLS PROCESSED FROM SOLUTION

(75) Inventors: A. Paul Alivisatos, Oakland, CA (US); Ilan Gur, San Francisco, CA (US); Delia Milliron, Menlo Park, CA (US)

(73) Assignee: The Regents of the University of California, Oakland, CA (US)

( * ) Notice: Subject to any disclaimer, the term of this patent is extended or adjusted under 35 U.S.C. 154(b) by 856 days.

(21) Appl. No.: 12/083,723

(22) PCT Filed: Oct. 20, 2006

(86) PCT No.: PCT/US2006/060140
§ 371 (c)(1),
(2), (4) Date: Apr. 24, 2009

(87) PCT Pub. No.: WO2007/065039
PCT Pub. Date: Jun. 7, 2007

(65) Prior Publication Data
US 2009/0217973 A1 Sep. 3, 2009

Related U.S. Application Data

(60) Provisional application No. 60/728,828, filed on Oct. 20, 2005.

(51) Int. Cl.
*H01L 31/00* (2006.01)
(52) U.S. Cl.
USPC ........... 136/256; 977/773; 977/762; 438/488; 257/E31.043; 257/E21.462
(58) Field of Classification Search ............... 136/256, 136/258, 260, 262, 264; 977/762, 773; 257/E21.462, 257/E21.043; 438/488
See application file for complete search history.

(56) References Cited

U.S. PATENT DOCUMENTS

| 4,463,216 A | 7/1984 | Nakano et al. |
| 4,633,034 A * | 12/1986 | Nath et al. ............... 136/256 |

(Continued)

FOREIGN PATENT DOCUMENTS

| JP | 61-219179 A | 9/1986 |
| JP | 07-115216 A | 5/1995 |

(Continued)

OTHER PUBLICATIONS

A. Romeo et al, Recrystallization in CdTe/CdS, 2000, Elsevier Science, Thin Solid Films 361-362, p. 420-425.*

(Continued)

*Primary Examiner* — Jonathan Johnson
*Assistant Examiner* — Andrew Golden
(74) *Attorney, Agent, or Firm* — Kilpatrick Townsend & Stockton LLP

(57) ABSTRACT

A photovoltaic device having a first electrode layer, a high resistivity transparent film disposed on the first electrode, a second electrode layer, and an inorganic photoactive layer disposed between the first and second electrode layers, wherein the inorganic photoactive layer is disposed in at least partial electrical contact with the high resistivity transparent film, and in at least partial electrical contact with the second electrode. The photoactive layer has a first inorganic material and a second inorganic material different from the first inorganic material, wherein the first and second inorganic materials exhibit a type II band offset energy profile, and wherein the photoactive layer has a first population of nanostructures of a first inorganic material and a second population of nanostructures of a second inorganic material.

19 Claims, 11 Drawing Sheets

U.S. PATENT DOCUMENTS

| | | | |
|---|---|---|---|
| 4,675,469 A | 6/1987 | Iida et al. | |
| 5,262,357 A | 11/1993 | Alivisatos et al. | |
| 5,720,827 A * | 2/1998 | Simmons | 136/250 |
| 6,821,559 B2 | 11/2004 | Eberspacher et al. | |
| 6,878,871 B2 | 4/2005 | Scher et al. | |
| 2002/0006470 A1 * | 1/2002 | Eberspacher et al. | 427/216 |
| 2004/0118448 A1 * | 6/2004 | Scher et al. | 136/252 |
| 2005/0098204 A1 | 5/2005 | Roscheisen et al. | |
| 2005/0150541 A1 | 7/2005 | Scher et al. | |

FOREIGN PATENT DOCUMENTS

| | | |
|---|---|---|
| JP | 08-008450 A | 1/1996 |
| JP | 2002-531958 A | 9/2002 |
| JP | 2005-520701 A | 7/2005 |
| JP | 2005-277426 A | 10/2005 |
| JP | 2005-538573 A | 12/2005 |
| WO | WO 01/99166 A1 | 12/2001 |
| WO | WO 2004/023527 A2 | 3/2004 |

OTHER PUBLICATIONS

A. Romeo et al, Development of Thin-film Cu(In, Ga)Se2 and CdTe Solar Cells, 2004, Wiley and Sons, Progress in Photovoltaics: Research and Applications vol. 12, p. 93-111.*

Schreder et al, "CdTe/CdS Clusters with Core-Sherll Structure in Colloids and Films: The Path to Formation and Thermal Breakup", 2000, J. Phys. Chem. B, 104 (8), 1677-1685.*

Singh et al, "Nano-structured CdTe, CdS and TiO2 for thin film solar cell applications", 2004, Solar energy materials & solar cells, 82, 315-330.*

Feldman, S. D., et al., "Non-Uniformity Mitigation in CdTe Solar Cells: The Effects of High-Resistance Transparent Conducting Oxide Buffer Layers," Photovoltaic Specialists Conference, 2005, Conference Record of the Thirty-First IEEE, Lake Buena Vista, Florida, USA, Jan. 3-7, 2005, Piscataway, New Jersey, USA, IEEE, Jan. 3, 2005, pp. 271-274, XP010822699.

Supplementary European Search Report for Application No. EP06848406.2, dated Feb. 5, 2010, 8 pages.

* cited by examiner

NANOCRYSTAL SOLAR CELLS PROCESSED FROM SOLUTION

CROSS-REFERENCE TO RELATED APPLICATIONS

This application is a National Stage of International Patent Application No. PCT/US2006/060140, filed Oct. 20, 2006, and claims priority to U.S. Provisional Application 60/728,828, filed on Oct. 20, 2005, which are herein incorporated by reference in their entirety for all purposes.

STATEMENT OF GOVERNMENT SUPPORT

The invention described and claimed herein was made in part utilizing funds supplied by the U.S. Department of Energy under Contract No. DE-AC03-76SF00098. The United States has certain rights in this invention.

BACKGROUND ART

Technical Field

The present invention relates to nanocrystals, and more particularly to photovoltaic cells formed from nanocrystals processed from solution.

Traditional photovoltaic technologies are prohibitively expensive as a result of the high costs associated with materials and processing. With ultra thin device structures and material systems that can be processed in solution, polymer-based organic photovoltaic cells have emerged with the potential to afford significant cost reductions in solar energy conversion. However, organic materials have spectrally limited absorption, low carrier mobilities, and long-term stability issues. These issues are barriers to achieving commercially viable device efficiencies.

Hybrid systems composed of organic polymers and inorganic nanocrystals have demonstrated enhancements in performance over conventional organic systems. Inorganic nanocrystals can enhance electron transport in semiconducting polymer solar cells. Although such hybrid systems have kept pace with their organic counterparts, their ultimate limitations may still be dictated by low mobility within and environmental sensitivity of the organic phase.

In connection with organic-based solar cells, a model has emerged that describes the operation of organic based solar cells relative to their conventional inorganic counterparts. Organic donor-acceptor (D-A) solar cells rely on type II heterojunctions, which serve to dissociate the strongly bound excitons characteristic of organic systems. Materials design for such a photovoltaic system can use energy band alignment of active materials to facilitate charge transfer. Examples to date have been limited to systems with at least one active organic component.

Studies of type II semiconductor nanocrystal heterostructures have shown that efficient charge transfer can also occur between two inorganic components with staggered energy levels. However, actual devices based in such systems have yet to be made and operated with reasonable stability and efficiency. In addition, recent research has revealed some similarities between nanocrystal films and organic molecular semiconductors. Like organic systems, nanocrystal films exhibit extremely low carrier concentrations and high trap densities, as well as confined excitations that can migrate between crystals. These properties are sufficient for solar energy conversion based on the D-A model.

Colloidal inorganic nanocrystals share all of the primary advantages of organics—scalable and controlled synthesis, solution processing, and a relative insensitivity to substitutional doping—while retaining the broadband absorption and superior transport properties of traditional photovoltaic semiconductors. A solar cell that relies exclusively on colloidal nanocrystals has not been made thus far. Clearly what is needed is all inorganic nanocrystal-based solar cell with good efficiency and reliable stability.

DISCLOSURE OF THE INVENTION AND BEST MODE FOR CARRYING OUT THE INVENTION

The embodiments of the present invention are directed toward solar cells based on dense nanocrystal films processed from solution. The nanocrystal films contain no organic materials. The embodiments of the present invention mark the first conception and reduction to practice of solar cells based on dense films of inorganic nanocrystals. The solar cell technology of the present invention takes advantage of a donor-acceptor (D-A), type II heterojunction between two disparate nanocrystal materials to facilitate charge separation and to enable power conversion. An exemplary system described herein uses a cadmium selenide (CdSe)/cadmium telluride (CdTe) nanorod system, but a number of other inorganic nanocrystal materials in a variety of shapes can be used in the embodiments of the invention.

FIG. 1A shows other material combinations which have staggered bands and small band gaps and are also suitable for nanocrystal device fabrication. Other suitable nanocrystals include combinations of ZnS, ZnSe, ZnTe, CdS, as well as other materials, such as InP, InAs, HgTe, GaN, GaP, GaAs, GaSb, InSb, Si, Ge, AlAs, AlSb, PbSe, PbS, and PbTe.

In some embodiments of the invention, solar cells have a blend structure. The blend structure is made from a solution containing both acceptor and donor nanocrystals. The structure can include a dense film on the order of 100-200 nm and sandwiched between two electrodes. In one embodiment, for example, aluminum and indium titanium oxide (ITO) are used for the electrodes.

In other embodiments of the invention, solar cells have a bilayer structure. The bilayer device can include a glass/ITO substrate, coated with a thin (~50 nm) film of donor nanocrystals, which is in thru coated with another thin film of acceptor nanocrystals; and having an aluminum back contact thermally evaporated onto the acceptor nanocrystal film. Further details of the devices, their fabrication, and their characterization are described below.

In fabricating photovoltaic devices, nanocrystals are spin-cast from a filtered pyridine solution, which creates ultrathin, flexible films of densely packed nanocrystals on virtually any substrate. In FIG. 1B, a representative scanning electron micrograph shows that typical spin-cast film of colloidal nanocrystals are homogeneous and pinhole-free over large areas. The film edge of this approximately 100 nm thick film is shown for contrast with the silicon substrate in the lower right corner. The scale bar represents 1 μm.

In accordance with the embodiments of the present invention, rod-shaped CdSe (FIG. 2A) and CdTe (FIG. 2B) nanocrystals are synthesized and prepared separately. Methods of synthesizing nanocrystal materials containing CdTc and CdSc have been described by Gur et al. in Science 310, 5747, pp. 462-465 (October 2005) and in supporting online material at www.sciencemag.org/cgi/content/full/310/5747/462/DC1, which are included by reference herein. A schematic energy band diagram in FIG. 2C illustrates the staggered band alignment of a prototypical CdTe—CdSe (D-A) pair. The valence and conduction band levels for CdTe and CdSe in FIG. 2C illustrate the type II charge-transfer junction formed between the two materials. Employing the effective mass approximation, bulk energy levels are modified to account for quantum confinement. Valence band edges for CdSe and CdTe rods are calculated to be −4.79 eV and −4.12 eV, respectively. Conduction band edges for CdSe and CdTe rods are calculated to be −6.64 eV and −5.85 eV, respectively.

Highly concentrated solutions containing both CdSe and CdTe nanocrystals can be used to fabricate devices as shown for a blend structure in FIG. 2D in an exemplary process. In one embodiment, nanocrystal films are spin-cast at approximately 1500-2000 rpm onto glass substrates coated with about 150 nm indium tin oxide (ITO) and a high resistivity transparent layer of about 2 Å (0.2 nm) alumina ($Al_2O_3$) deposited by atomic layer deposition. A saturated solution of $CdCl_2$ in methanol is then spin-cast onto the samples at about 1500 rpm, and the samples are heated at 400° C. in oxygen for approximately 15 minutes. Thereafter, the samples are held at approximately $10^{-6}$ torr overnight. Top electrodes are deposited by thermal evaporation through a shadow mask, resulting in individual devices with a nominal active area of approximately 0.03 $cm^2$.

In another embodiment, a high-quality bilayer device is fabricated with minimal intermixing at the interface using a process similar to the process described with reference to FIG. 2D. Planar D-A heterojunctions are fabricated by sequentially spin-casting films of CdTe and then CdSe on glass coated with ITO. Thermally deposited aluminum can be used as a reflective top contact. After spin-casting the CdTe film, the sample is annealed for 15 min at approximately 200° C. to remove residual solvent before subsequent deposition of the CdSe film. For sintering, a saturated solution of cadmium chloride ($CdCl_2$) in methanol is spin-cast onto the bilayer sample at about 1500 rpm, after which the sample is heated at approximately 400° C. in oxygen for 15 minutes.

FIGS. 3A-3C show SEM images for sintered and unsintered films at the same magnification. FIG. 3A shows a typical spin-cast unsintered film. The film is homogeneous and defect-free. The film edge of the approximately 100 nm film is shown for contrast with the silicon substrate on the right. FIG. 3B shows a CdTe film that has been exposed to $CdCl_2$ and baked in air at approximately 400° C. for about 15 minutes. FIG. 3C shows a CdSe film that has been exposed to $CdCl_2$ and baked in air at approximately 400° C. for about 15 minutes. As can be seen in FIGS. 3B and 3C, the films have undergone recrystallization and grain growth during sintering. It should be noted that the change in film morphology shown in FIGS. 3B and 3C is not observed when the films are sintered without exposure to $CdCl_2$ and air.

FIG. 4A is a schematic diagram showing an exemplary bilayer structure 400 for an electronic device, according to an embodiment of the invention. The device 400 has a first transparent electrode 410 which can be made from a material such as ITO. There is a second electrode 420 which can be made from a conducting material such as aluminum. In some arrangements, the second electrode 420 is made from a reflecting metal. Adjacent the first electrode 410 there is a high resistivity transparent (HRT) film or buffer layer 430, such as alumina ($Al_2O_3$). Between the film 430 and the second electrode 420 are disposed a first layer of active semiconducting material 440 that can act as a donor and a second layer of active semiconducting material 450 that can act as an acceptor. In one example, the donor semiconducting material 440 is a CdTe nanocrystal film and the acceptor semiconducting material 450 is a CdSc nanocrystal film. FIG. 4B is an energy band gap diagram corresponding to the device 400 of FIG. 4A. The CdTe and the CdSe nanocrystal films were both pretreated with $CdCl_2$ prior to sintering.

FIG. 4C is a schematic diagram showing an exemplary blend structure 405 for an electronic device, according to an embodiment of the invention. The device 405 has a first transparent electrode 415 which can be made from a material such as ITO. There is a second electrode 425 which can be made from a conducting material such as aluminum. In some arrangements, the second electrode 425 is made from a reflecting metal. In one arrangement, there is a high resistivity transparent film or buffer film 435, such as $Al_2O_3$ adjacent the first electrode 415. Between the film 435 and the second electrode 425 is disposed a layer of active semiconducting material 445 that includes a mixture of donor and acceptor nanocrystals. FIG. 4D is an energy band gap diagram corresponding to the device 405 of FIG. 4B. The CdTe/CdSe nanocrystal blended film was pretreated with $CdCl_2$ prior to sintering.

FIG. 5A shows a normalized photo-action spectrum of a typical bilayer device after sintering. The device that was sintered (solid line) has a broadened spectral response and enhanced external quantum efficiencies (approaching 70%) as compared to the unsintered device (dotted line). The photoresponse of sintered CdTe/CdSe bilayer cells mirrors the drastic rise in photoconductivity exhibited by the active layers. As expected, the spectrum for the sintered device reflects a strong red-shift in the onset of photocurrent to the bulk absorption edge. In one example, the short circuit current ($I_{sc}$), which is a measure of the maximum current, is 11.6 mA/$cm^2$, the open circuit voltage ($V_{oc}$), which is a measure of the maximum output voltage, is 0.40 V and the fill factor (FF) is 0.45. The resulting solar cell demonstrates a power conversion efficiency of 2.1% under simulated AM1.5G illumination.

FIG. 5B shows the current-voltage (I-V) characteristics of a typical bilayer device before sintering (dotted line) and after sintering (solid line), measured at simulated one-sun AM1.5G illumination. The sintered cell shows more than an order of magnitude enhancement in photocurrent whereas the open-circuit voltage remains virtually unchanged. In one example, the $V_{oc}$ is approximately 0.41 V, and the $I_{sc}$, is approximately 11.6 mA/$cm^2$ for the sintered films. Non-sintered films have a characteristic $V_{oc}$ of about 0.40 and a $I_{sc}$ of about 0.58 mA/$cm^2$. Furthermore, the improved $V_{oc}$ and $I_{sc}$ characteristics results in a power conversion efficiency (PCE) of 2.1% for the sintered films as compared to a PCE of 0.1% for the non-sintered films. This suggests that the driving force for charge extraction is the same in sintered and unsintered devices.

As indicated by the results shown in FIGS. 5A and 5B, the high surface trap area inherent in a densely packed array of nanocrystals can be minimized and the carrier transport in the device can be improved by annealing and sintering the crystals. In one embodiment, nanocrystal films are exposed to a saturated solution of $CdCl_2$ in methanol and annealed at 400° C. in air for 15 min. After sintering, films of CdSe and CdTe remains insulating in the dark, but shows an approximately two order of magnitude enhancement in photoconductivity. The sintering process seems to improve carrier transport, but does not appear to result in significant doping.

By varying simple system parameters such as electrode material, even higher efficiencies can be achieved in sintered nanocrystal cells. FIG. 5C shows the I-V characteristics for a device that has a calcium top contact capped with aluminum according to an embodiment of the invention. In one arrangement, the top contact had 20 nm calcium capped with 80 nm aluminum. Devices with the Ca/Al top contact have power conversion efficiencies as high as 2.9% (with AM1.5G), a $I_{sc}$ of 13.2 mA/cm², a $V_{oc}$ of 0.45 V, and a FF of 0.49

FIG. 6A shows the normalized photocurrent spectral response of a typical bilayer cell (ITO/100 nm CdTe/100 nm CdSe/Al) (bold line) alongside solution-phase absorption spectra for CdTe (dotted line) and CdSe (thin line) nanocrystals. The photoaction spectrum reflects the red CdTe absorption edge and the prominent CdSe exciton peak, indicating that both components contribute to the photocurrent.

In FIG. 6B, current-voltage characteristics for the bilayer device in the dark (dotted line) and under simulated one-sun AM1.5G illumination (bold line) are shown. The device exhibits a strong photoresponse and diode rectification both in the dark and in the light. The device behaves as a rectifying diode with a significant photovoltaic response. Illumination affords an enhancement in device conductivity of more than three orders of magnitude. In addition, this representative cell exhibits a significant photovoltaic effect, with a short-circuit current ($I_{sc}$) of 0.58 mA/cm², open circuit voltage ($V_{oc}$) of 0.41 V, and fill factor (FF) of 0.40.

In order to better appreciate charge transfer characteristics in facilitating photovoltaic energy conversion, devices made of a thin-film of only one nanocrystal material were compared with cells containing charge transfer junctions between the two types of crystals. The devices had comparable thicknesses of active materials on the order of 100 nm and comparable optical densities across the spectrum.

FIG. 6C provides a comparison between single type nanocrystal cells, blend cells and bilayer cells of external quantum efficiency (EQE) spectra collected under low-intensity illumination (~5×10⁻² mW/cm²). A direct comparison of external quantum efficiencies in the CdTe-only (thin solid line), CdSe-only (thin dotted line), CdTe/CdSe bilayer (thick solid line), and blend (thick dotted line) devices shows a significant enhancement in creation and extraction of carriers due solely to the presence of a charge transfer interface within the device. The comparison serves to illustrate the role of charge transfer in photocurrent generation.

As is the case in organic systems, separation of electrons and holes across an interface enhances the diffusional driving force for charge extraction while reducing the likelihood of exciton recombination. Similarly, devices composed of intimately mixed blends of CdSe and CdTc nanocrystals exhibit enhanced quantum efficiencies over single-material cells, offering further evidence that the photoaction of the devices of the present invention is based on a D-A junction rather than a conventional planar p-n junction.

The I-V characteristics of the devices measured in FIG. 6C were also compared under simulated AM1.5G illumination. As noted above, cells based on heterojunction bilayers (thick solid line) exhibit good diode behavior with strong rectification. By comparison, I-V characterization of devices composed of only CdTe (thin solid line) or only CdSe (thin dotted line) shows no significant rectification. It can thus be deduced that the observed photovoltaic effect in the bilayer is not a result of Schottky contacts to either material, but rather is due to the intended heterojunction. Devices composed of intimately mixed blends of CdSe and CdTe nanocrystals (thick dotted line) show lower short circuit currents than bilayer devices, despite the comparable EQEs shown in FIG. 6C. This can be attributed to the difference in illumination conditions between these two measurements. Due to instrument limitations, spectral response curves were measured at nearly four orders of magnitude lower illumination intensity than the simulated 100 mW/cm² AM1.5G conditions used in I-V comparisons. Increased leakage and recombination in the blend devices may be responsible for this discrepancy.

Solar cells as described in the embodiments of the present invention are distinguishable over conventional thin film heterojunction solar cells. Conventional semiconductor solar cells depend on a junction between bulk p- and n-doped materials to form a built-in field, which then acts as the primary driving force for minority carrier extraction. Similar to organic semiconductors, colloidal nanocrystals are characterized by extremely limited free-carrier concentrations. In fact, three-dimensional CdSe colloid arrays have been found to contain essentially no free carriers without illumination. As such, the creation of a depleted junction in nanocrystal solar cells is highly unlikely.

Furthermore, CdSe and CdTe films are electrically insulating in the dark. Measuring surface conduction across a 1 mm gap between two aluminum electrodes yields linear I-V curves, from which sheet resistances exceeding 500 G-ohms per square, a value limited by the measurement apparatus, can be extracted for films of either material on glass substrates. Exposing the films to 1.00 mW/cm² full-sun irradiation effects a dramatic rise in conductivity. Sheet resistances, now measurable, dropped at least one order of magnitude under illumination. Likewise, illumination affords a greater than three order of magnitude enhancement in conductivity of the device itself (FIG. 6B). This strong photoconductive effect suggests that these materials, like their organic counterparts, have an extremely limited number of untrapped carriers in the dark, and are better characterized by a rigid band model than one that employs band bending.

While not wishing to be limited to any particular theory, these effectively undoped active materials suggest a mechanism for photovoltaic conversion based on donor-acceptor charge transfer. Photoexcitations that probe the CdTe/CdSe junction experience an energetic driving force for charge transfer, with holes finding lower energy states in CdTe and electrons finding lower states in CdSe. Carrier extraction is driven not by means of a built-in field created from a depletion region of substitutional dopants; rather, extraction may be driven primarily by directed diffusion, as dictated by the type II heterojunction. After absorption and charge transfer, majority holes in the CdTe readily diffuse into the ITO, but are blocked from moving through the CdSe toward the Al electrode. Likewise, majority electrons in the CdSe can diffuse only toward the Al, and not through the CdTe to the ITO. The well-accepted metal-insulator-metal model, in which electrodes of disparate work function equilibrate to form a field across the dielectric active materials, offers an additional driving force for carrier extraction.

Having ruled out the presence of conventional p-n or Schottky junctions, it is believed that the bilayer nanocrystal cell operates by means of the diffusion-assisted D-A heterojunction typical of organic devices. However, several characteristics of the nanocrystal solar cell set it apart from its organic-based counter parts. The most efficient organic solar cells are based on distributed heterojunctions, but devices based on simple blends of donor and acceptor nanocrystals (FIG. 6D) neither rectify nor produce a significant photovoltage. In contrast to organic systems, common electrodes do not readily form selective contacts to either the donor or acceptor nanocrystals. Electrons and holes can be injected into either material, such that blend cells pass current in both forward and reverse bias.

Another fundamental distinction for the nanocrystal cells in the embodiments of the invention has direct consequences for the performance of these devices. While a heterojunction may be required to produce free charges from excitons in organic systems efficiently, this is not the case for the nanocrystal-based devices as described herein. Rod-shaped nanocrystals with high aspect ratios exhibit little confinement along the length of the rod. Excitons can thus dissociate over this dimension, creating free carriers throughout the nanocrystal film. In organic systems, free carriers are created only when otherwise tightly bound excitons are separated across the D-A junction.

With both free electrons and holes residing in the donor and acceptor materials, carriers are more susceptible to recombination in the nanocrystal system of the present invention. This recombination is compounded by a large density of surface states on the nanocrystals, which act to trap carriers as they move through the film. Indeed, detrimental recombination losses are observed in the low quantum efficiency of some nanocrystal cells as compared with similar devices made from organic semiconductors.

Power output is the product of the current times the voltage. FIG. 7A shows current-voltage curves for a bilayered buffered device (dotted line) and for a non-buffered device (solid line). Power output (product of $V_{oc}$ and $I_{sc}$) is greater for the buffered device. Although adding an HRT buffer layer results in an increased voltage, if the layer is too thick, the current is decreased and the resulting power output can be reduced. The thickness of the novel HRT buffer layer can be chosen to maximize power output for an inorganic nanocrystal photovoltaic cell. FIG. 7B shows I-V curves for devices with three different thickness of HRT buffer layer: 1 Å (0.1 nm) $Al_2O_3$ (dashed line), 2 Å (0.2 nm) $Al_2O_3$ (solid line), and 3 Å (0.3 nm) $Al_2O_3$ (dotted line). Power output is maximum for the HRT layer thickness of 2 Å (0.2 nm) as this yields a maximum product of $V_{oc}$ and $I_{sc}$. FIG. 7B also shows that the 1 Å layer is too thin resulting in a partial shunting effect with a reduced $V_{oc}$ and that the 3 Å (0.2 nm) layer is too thick resulting in a reduced $I_{sc}$. Other thicknesses can be selected for different photovoltaic cells using this technique.

Another remarkable characteristic of the inorganic nanocrystal solar cells according to an embodiment of the invention is that whether sintered or not, the cells exhibited no strong sensitivity to photo-oxidation, unlike organic-based devices; in fact, aging appears to improve rather than deteriorate their performance. As is generally known, organic or organic nanocrystal photovoltaic cells are encapsulated to avoid the adverse effects of their exposure to air.

FIG. 8 shows the AM1.5G full-sun behavior of an exemplary sintered device characterized in air before (solid line) and after (dotted line) open-circuit exposure to ambient atmosphere and lighting for 13,000 hours. The cell shows only a 1.4% decrease in short-circuit current, while the fill-factor rises 4.4% and the open-circuit voltage increases by more than 10%. Overall, the atmospheric aging results in a 13.6% increase in efficiency. FIG. 9 is a graph of current density vs. time (hours) showing the results of light-soaking experiments on nanocrystal solar cells according to an embodiment of the invention. There is less than 2% degradation in photocurrent after 14 hours at short-circuit under simulated AM1.5G illumination with no encapsulation. These phenomena serve to illustrate the robustness of this system over its organic counterparts.

The devices in accordance with the embodiments of the present invention provide solar cells based entirely on colloidal semiconductor nanocrystals. They are ultra-thin, solution-processed, and stable in ambient environments. Having dense nanocrystal films that mirror the basic properties of semiconducting polymers, these cells function as a new class of diffusion assisted donor-acceptor heterojunction. Sintering is found to enhance the performance of these devices, allowing for air-stable power conversion efficiencies up to 2.9%. The nanocrystal solar cells of the present invention enable the achievement of stable and low-cost solar energy conversion.

INDUSTRIAL APPLICABILITY

Figure 1A:
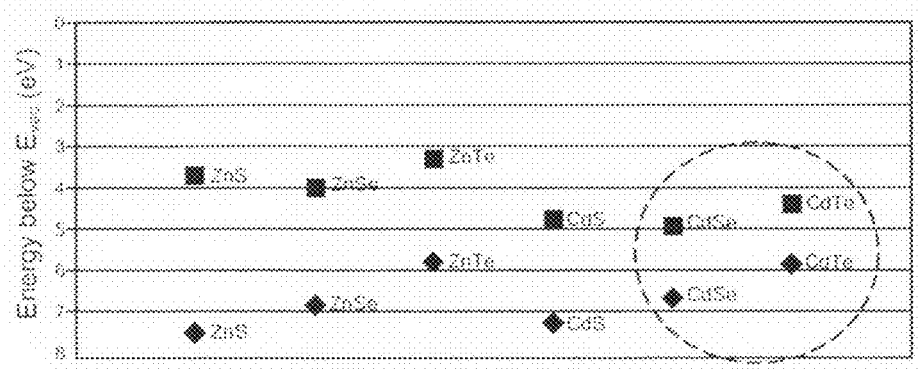
FIG. 1A is an energy diagram of valence and conduction band levels for CdTe and CdSe, as well as for combinations of ZnS, ZnSe, ZnTe, and CdS.
Figure 1B:
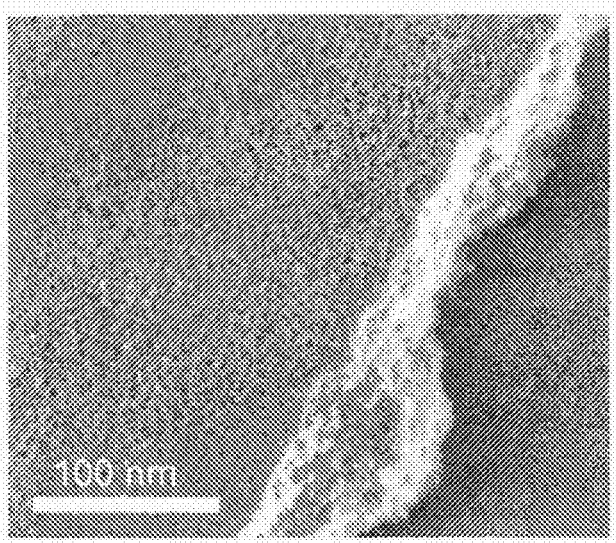
FIG. 1B is a scanning electron micrograph of an exemplary spin-cast film of colloidal nanocrystals; the film edge of this ca. 100 nm film is shown for contrast with the silicon substrate.
Figure 2A:
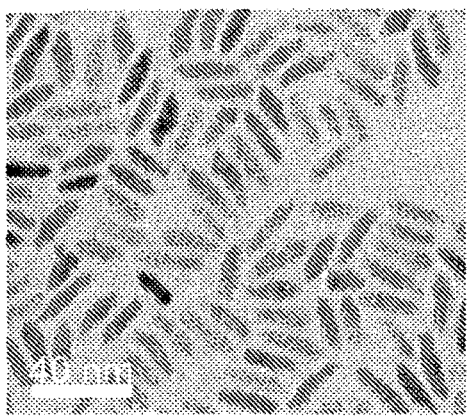
FIG. 2A is a transmission electron micrograph (TEM) of CdSe nanocrystals used in one embodiment of the films of the photovoltaic cells of the present inventions.
Figure 2B:
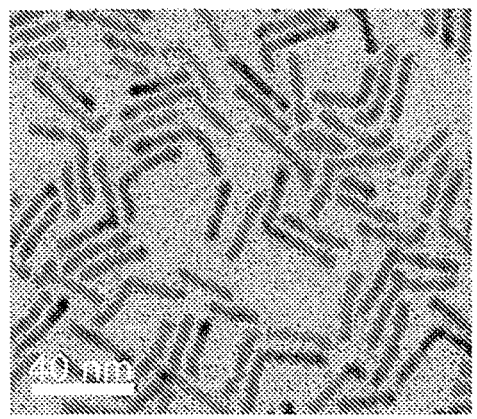
FIG. 2B is a TEM of CdTe nanocrystals used in one embodiment of the films of the photovoltaic cells of the present inventions.
Figure 2C:
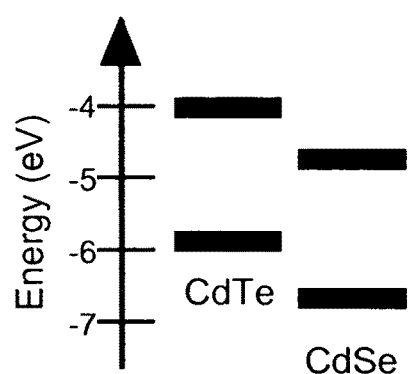
FIG. 2C is an energy diagram of valence and conduction band levels for CdTe and CdSe.
Figure 2D:
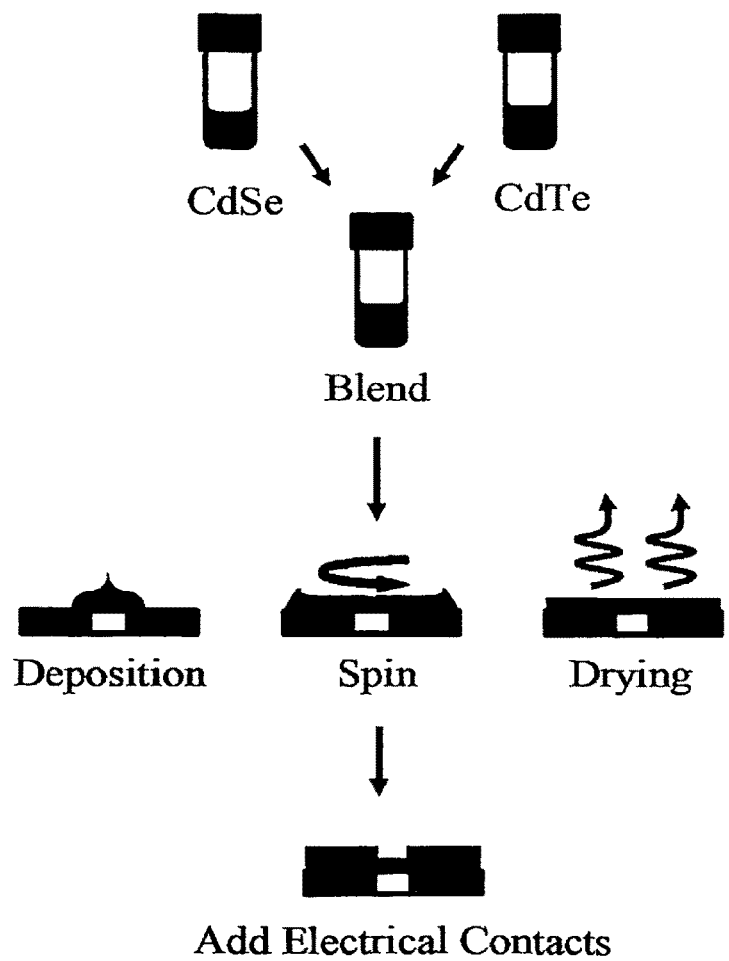
FIG. 2D is an exemplary diagram showing an embodiment of a process for the synthesis and the fabrication of the devices of the present invention.
Figure 3A:
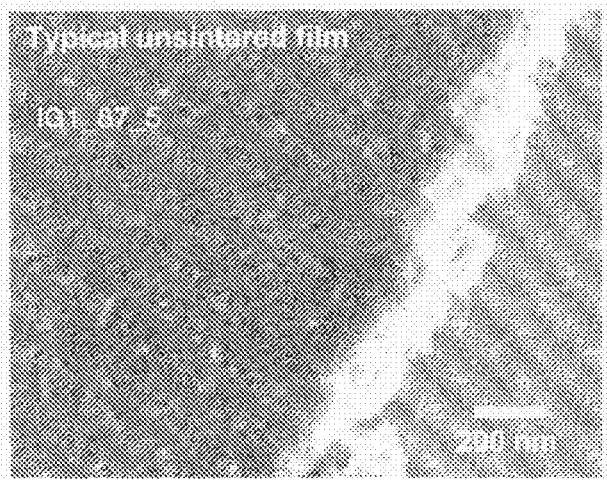
FIG. 3A is a scanning electron microscope image for an unsintered nanocrystal film.
Figure 3B:
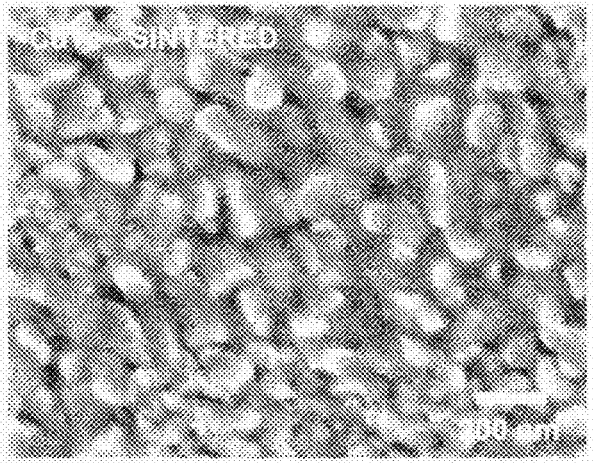
FIG. 3B is a scanning electron microscope image of a sintered CdTc film exposed to $CdCl_2$.
Figure 3C:
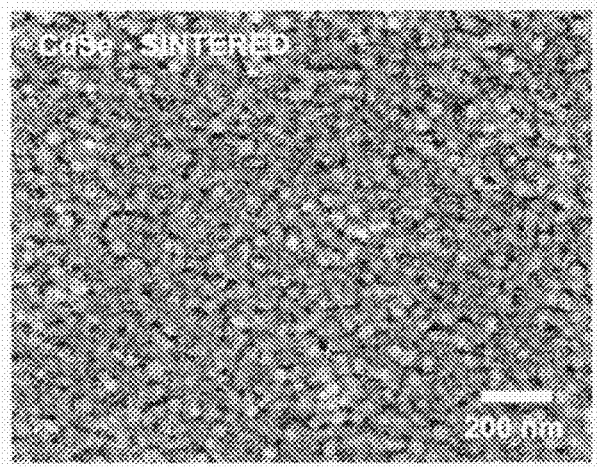
FIG. 3C is a scanning electron microscope image of a sintered CdSe film exposed to $CdCl_2$.
Figure 4A:
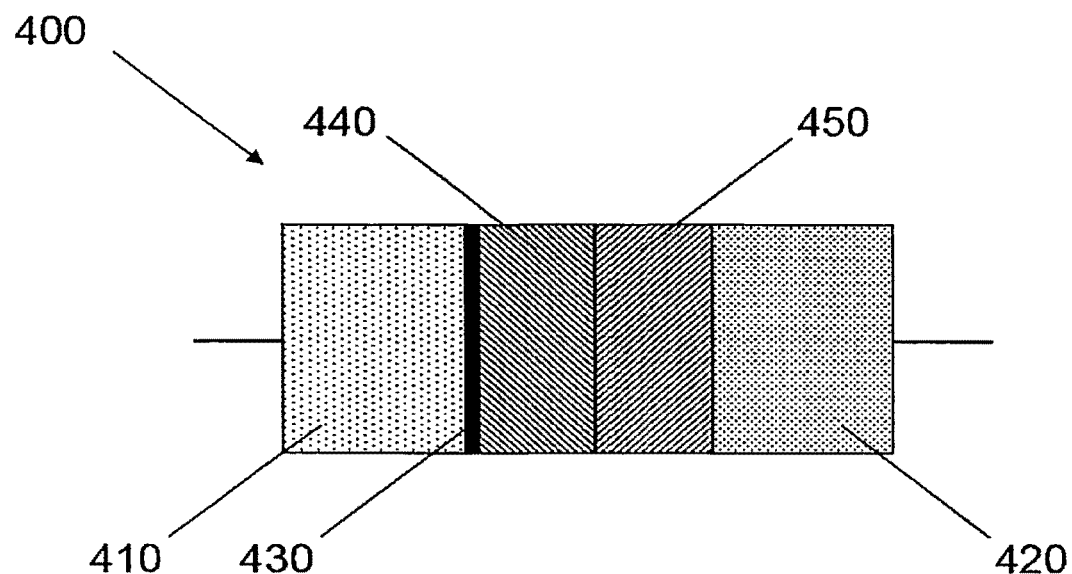
FIG. 4A is an exemplary diagram showing one embodiment of a general device structure in accordance with the present invention.
Figure 4B:
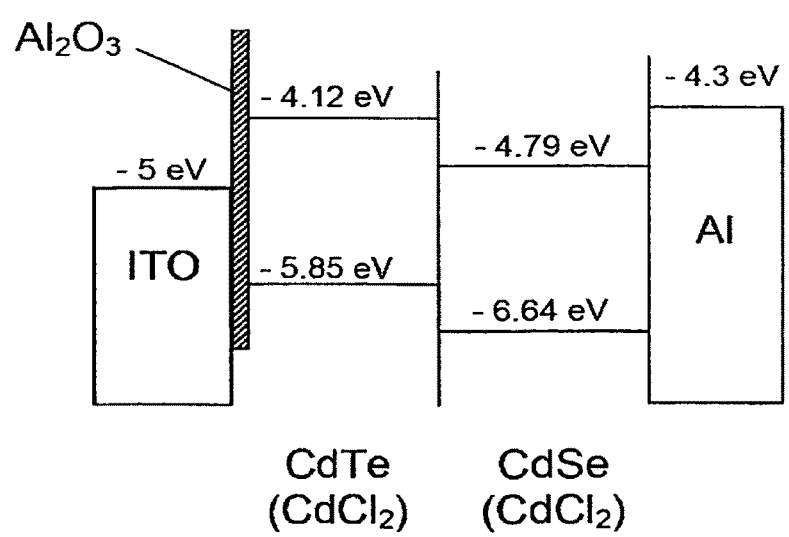
FIG. 4B is a band-gap energy diagram corresponding to the device of FIG. 4A.
Figure 4C:
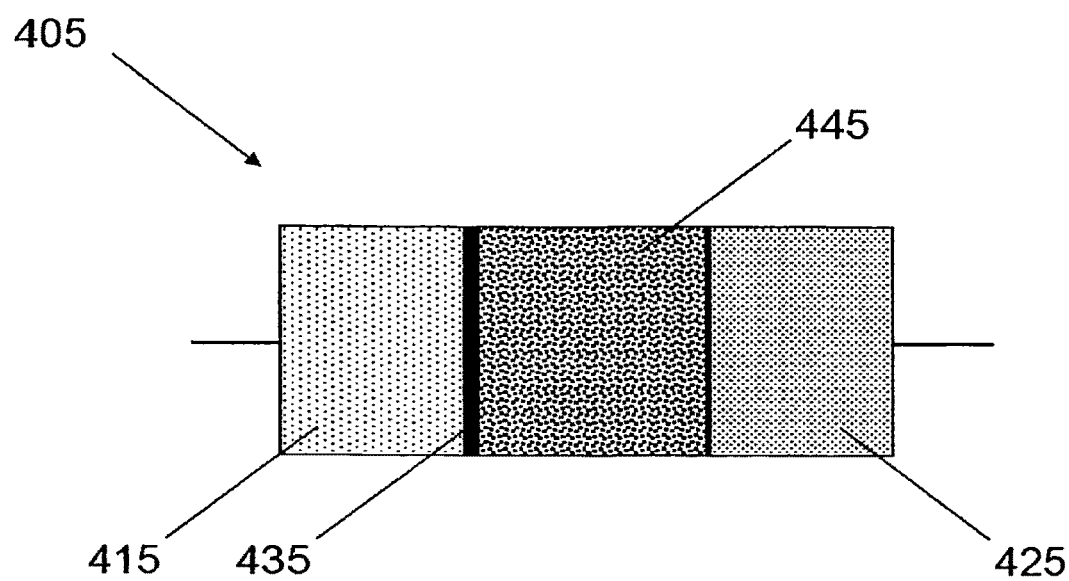
FIG. 4C is an exemplary diagram showing an alternate embodiment of a general device structure in accordance with the present invention.
Figure 4D:
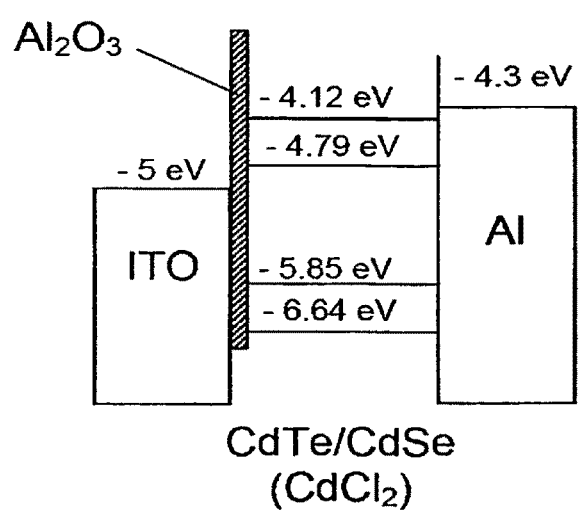
FIG. 4D is a band-gap energy diagram corresponding to the device of FIG. 4C.
Figure 5A:
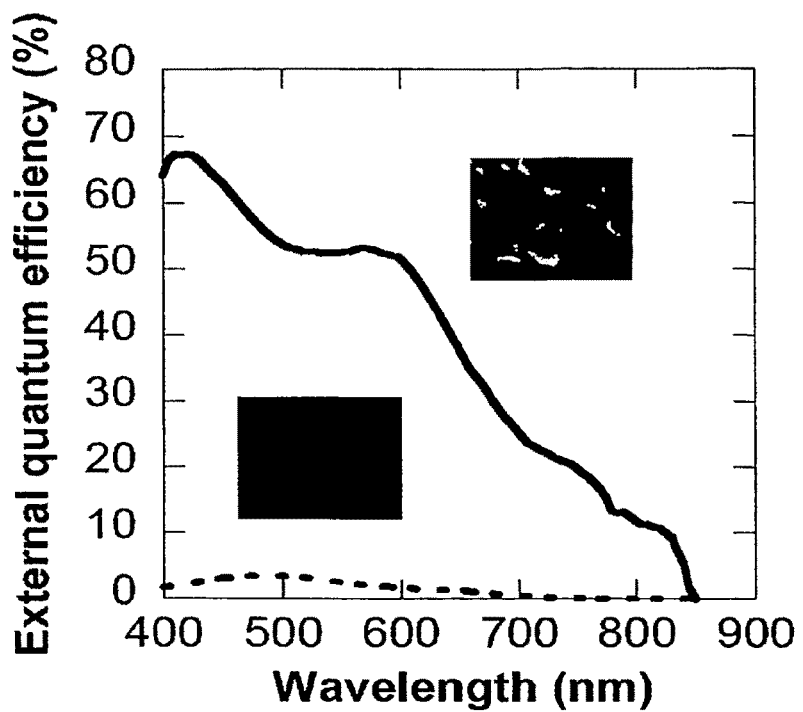
FIG. 5A is a graph of external quantum efficiency vs. wavelength for films that were sintered as compared to unsintered films.
Figure 5B:
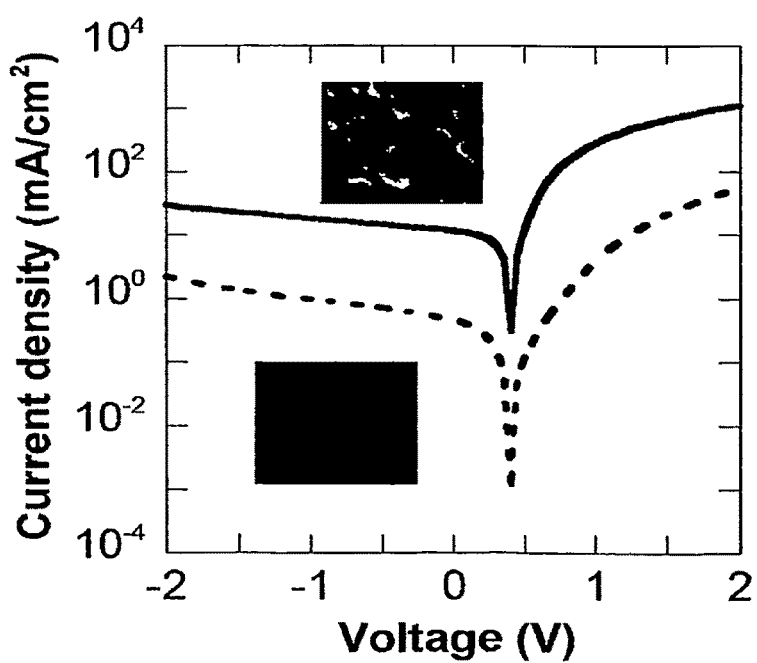
FIG. 5B is a graph of current density vs. voltage for films that were sintered as compared to unsintered films.
Figure 5C:
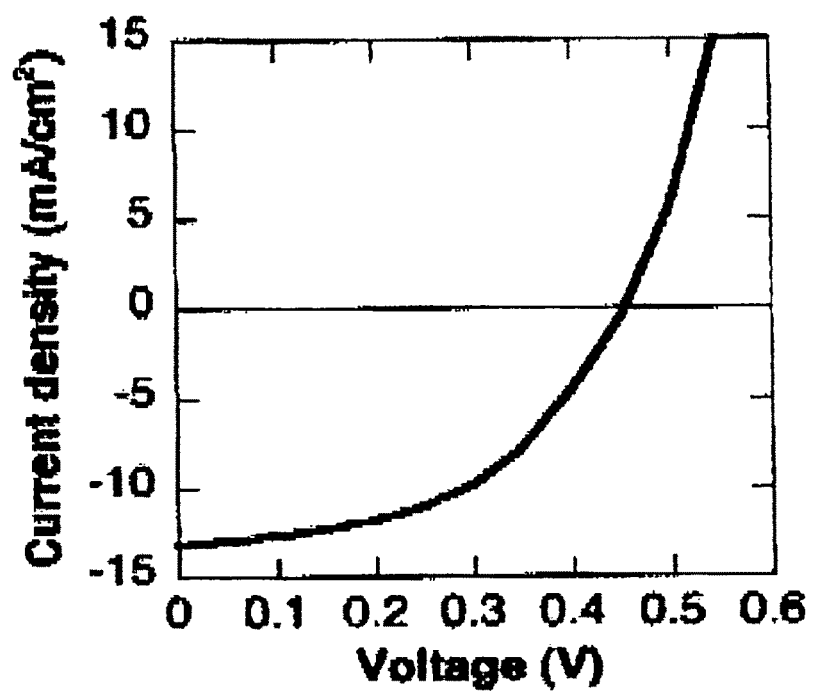
FIG. 5C shows the I-V characteristics for a device that has a calcium top contact capped with aluminum according to an embodiment of the invention.
Figure 6A:
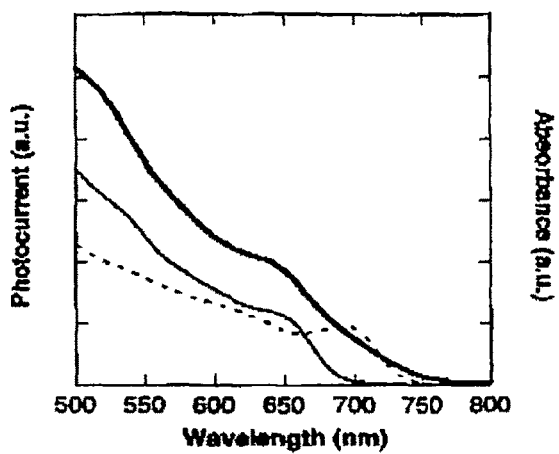
FIG. 6A is a graph of the normalized photocurrent spectral response of an ITO/100 nm CdTe/100 nm CdSe/Al bilayer device in accordance with the embodiments of the present invention.
Figure 6B:
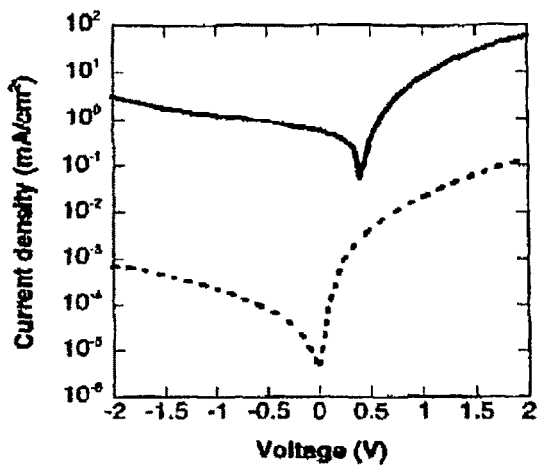
FIG. 6B is a graph of the current-voltage characteristics for the device of FIG. 6A.
Figure 6C:
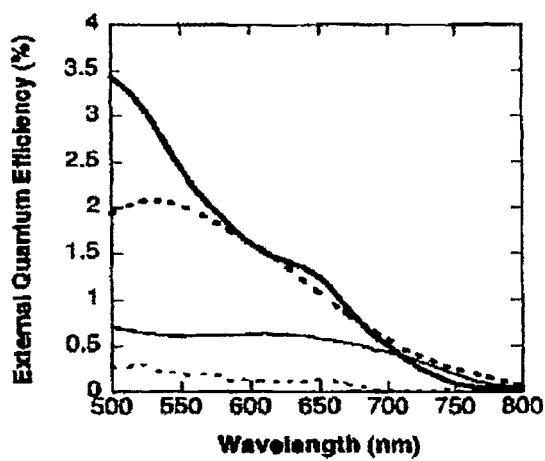
FIG. 6C is a graph of a comparison of external quantum efficiency spectra collected under low-intensity illumination ($\sim 5 \times 10^{-2}$ $mW/cm^2$) for various devices.
Figure 6D:
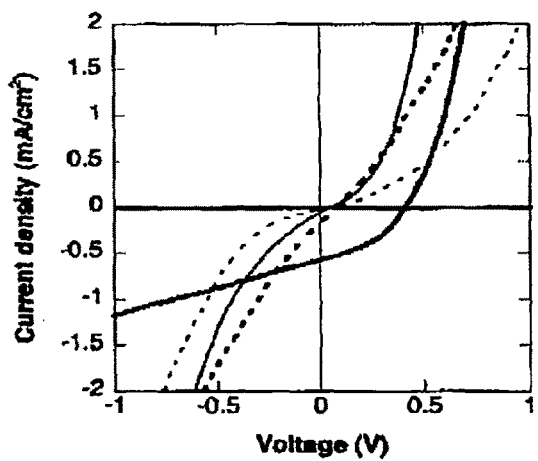
FIG. 6D is a graph of a comparison of current-voltage characteristics collected under simulated AM1.5G illumination for the same devices as in FIG. 6C.
Figure 7A:
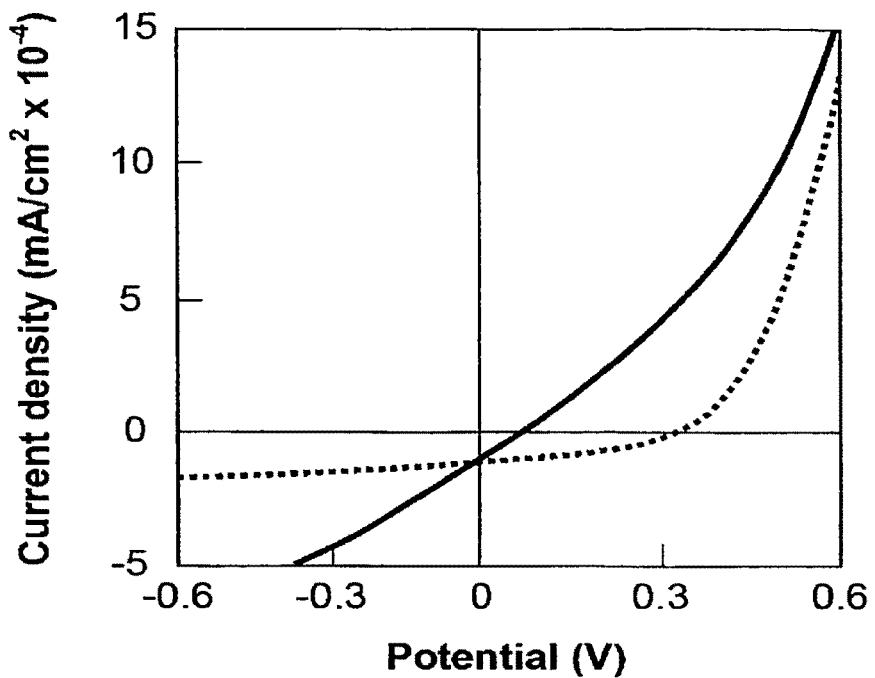
FIG. 7A shows current-voltage curves for a bilayered buffered device (dotted line) and for a non-buffered device (solid line).
Figure 7B:
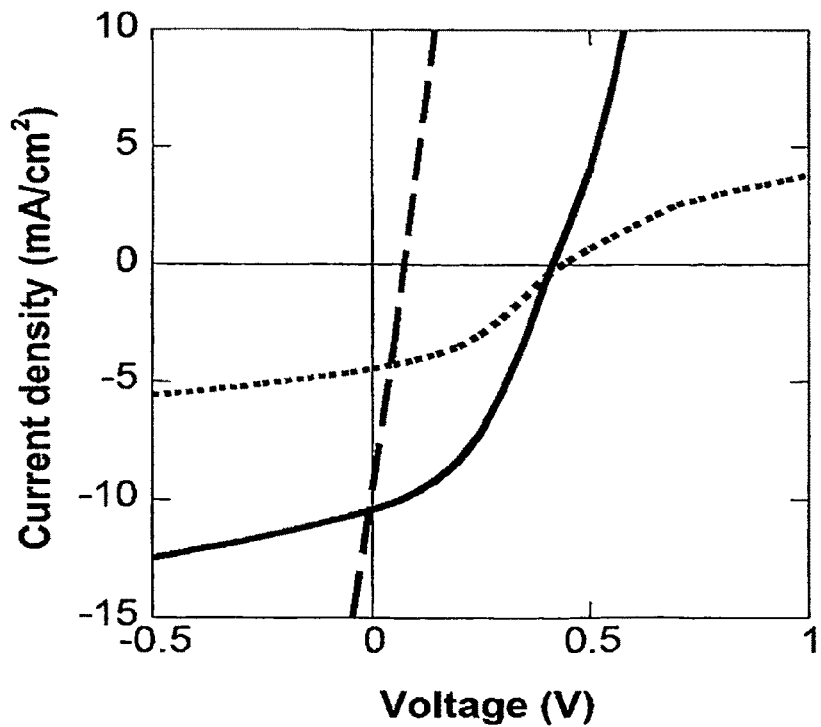
FIG. 7B shows I-V curves for devices with three different thickness of HRT buffer layer: 1 Å (0.1 nm) $Al_2O_3$ (dashed line), 2 Å (0.2 nm) $Al_2O_3$ (solid line), and 3 Å (0.3 nm) $Al_2O_3$ (dotted line).
Figure 8:
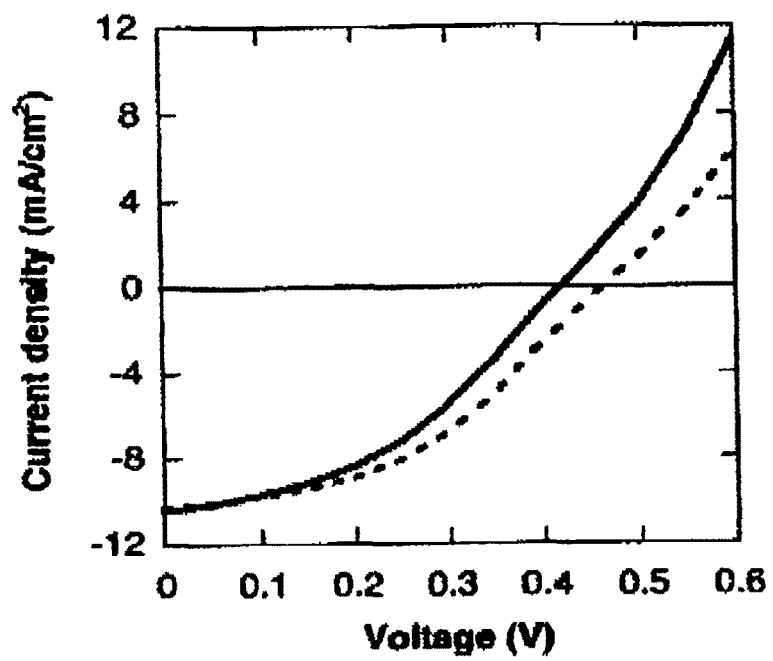
FIG. 8 shows a graph of current-voltage behavior at simulated one-sun AM1.5G illumination for a typical sintered bilayer device upon first exposure to air (solid) and after 13,000 hours' exposure to ambient atmosphere and light at open-circuit.
Figure 9:
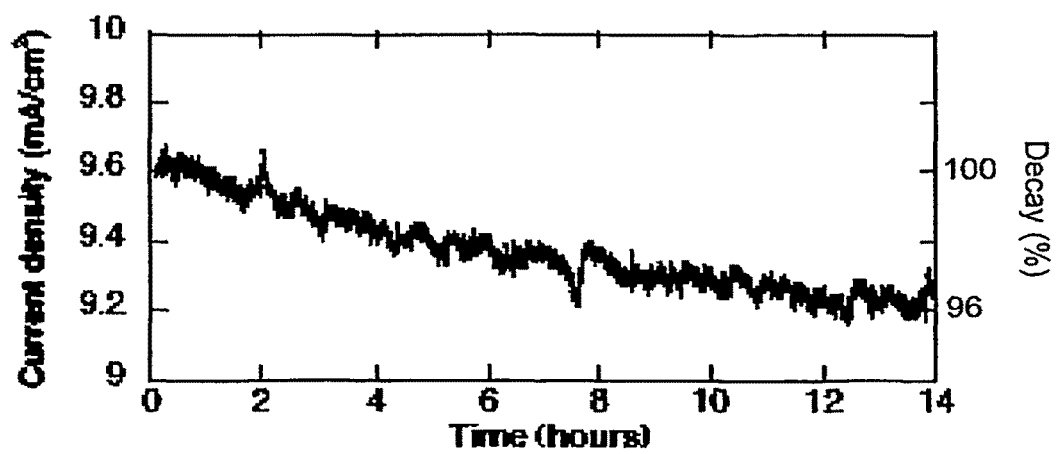
FIG. 9 is a graph of current density vs. time (hours) showing an exemplary change in overall illumination intensity for the inorganic nanocrystal photovoltaic cells in accordance with the embodiments of the present invention.

Traditional photovoltaic technologies are prohibitively expensive as a result of the high costs associated with materials and processing. With ultra thin device structures and material systems that can be processed in solution, polymer-based organic photovoltaic cells have emerged with the potential to afford significant cost reductions in solar energy conversion. However, organic materials have spectrally limited absorption, low carrier mobilities, and long-term stability issues. These issues are barriers to achieving commercially viable device efficiencies.

Colloidal inorganic nanocrystals share all of the primary advantages of organics—scalable and controlled synthesis, solution processing, and a relative insensitivity to substitutional doping—while retaining the broadband absorption and superior transport properties of traditional photovoltaic semiconductors. A solar cell that relies exclusively on colloidal nanocrystals and has good efficiency and reliable stability will help to break the barriers associated with widespread commercialization of inexpensive photovoltaic devices.

As will be understood by those skilled in the art, the present invention may be embodied in other specific forms without departing from the essential characteristics thereof. For example, the donor-acceptor active layer can be in the form of a bi-layer or a blend. Furthermore, the non-transparent electrode can be made of any suitable conducting material. These other embodiments are intended to be included within the scope of the present invention, which is set forth in the following claims.

What is claimed is:

1. A method of forming a bulk layer substantially free of organic material, comprising:
   a. depositing a first solution of nanocrystals onto a substrate to form a nanocrystal film; and
   b. heating the nanocrystal film at a temperature of about 200-400 C in an oxygen containing atmosphere to substantially remove any organic material, such that the nanocrystal film recrystallizes and undergoes a crystal grain growth, thereby forming the bulk layer substantially free of organic material, wherein the formed bulk layer has a thickness of about 100-200 nm.

2. The method of claim 1, wherein the heating is conducted at a temperature of about 400 C.

3. The method of claim 1, wherein the bulk layer contains no organic material.

4. The method of claim 1, further comprising after the depositing step and before the heating step:
   a1. depositing a solution of $CdCl_2$ onto the nanocrystal film.

5. The method of claim 1, further comprising after the depositing step and before the heating step
   a2. spin-casting a second solution of nanocrystals onto the nanocrystal film to form a bi-layer nanocrystal film, wherein the second solution nanocrystals are different than the first solution nanocrystals.

6. The method of claim 1, further comprising
   c. holding the bulk layer at a pressure of about $10^{-6}$ torr.

7. A solar cell comprising a bulk layer substantially free of organic material, the bulk layer comprising:
   a first population of nanostructures of a first inorganic material, and
   a second population of nanostructures of a second inorganic material different from the first inorganic material, wherein the first and second inorganic materials exhibit a type II band offset energy profile,
   wherein the bulk layer is substantially free of organic material, and wherein the bulk layer is prepared by the process comprising:
   a. depositing a first solution of nanocrystals onto a substrate to form a nanocrystal film; and
   b. heating the nanocrystal film at a temperature of about 200-400 C in an oxygen containing atmosphere to substantially remove any organic material, such that the nanocrystal film recrystallizes and undergoes a crystal grain growth, thereby forming the bulk layer substantially free of organic material, wherein the formed bulk layer has a thickness of about 100-200 nm.

8. The solar cell of claim 7, wherein the nanocrystals comprise nanorods.

9. The solar cell of claim 8, wherein at least a portion of the nanorods comprises a material selected from the group consisting of Group II-VI, Group III-V, and Group IV semiconductors and alloys thereof.

10. The solar cell of claim 9, wherein the nanorods comprise a material selected from the group consisting of CdSe, CdTe, InP, InAs, CdS, ZnS, ZnSc, ZnTc, HgTc, GaN, GaP, GaAs, GaSb, InSb, Si, Gc, AlAs, AlSb, PbSe, PbS, PbTe, and combinations thereof.

11. The solar cell of claim 8, wherein the nanorods comprise a core of a first inorganic material and a shell of a second inorganic material.

12. The solar cell of claim 11, wherein the core comprises CdSe and the shell comprises CdTe.

13. The solar cell of claim 11, wherein the core comprises InP and the shell comprises GaAs.

14. A solar cell, comprising:
   a first electrode layer;
   a high resistivity transparent film disposed on the first electrode;
   a second electrode layer; and
   an inorganic photoactive layer disposed between the first and second electrode layers,
      wherein the inorganic photoactive layer is disposed in at least partial electrical contact with the high resistivity transparent film, and in at least partial electrical contact with the second electrode,
   wherein the photoactive layer comprises a first inorganic material and a second inorganic material different from the first inorganic material, wherein the first and second inorganic materials exhibit a type II band offset energy profile, and wherein the photoactive layer comprises a first population of nanostructures of a first inorganic material and a second population of nanostructures of a second inorganic material, and
   wherein the inorganic photoactive layer is prepared by the process comprising:
   a. depositing a first solution of nanocrystals onto a substrate to form a nanocrystal film; and
   b. heating the nanocrystal film at a temperature of about 200-400 C in an oxygen containing atmosphere to substantially remove any organic material, such that the nanocrystal film recrystallizes and undergoes a crystal grain growth, thereby forming a bulk layer substantially free of organic material, wherein the formed bulk layer has a thickness of about 100-200 nm.

15. The method of claim 1, wherein the formed bulk layer is substantially free of pinhole defects.

16. The solar cell of claim 7, wherein the formed bulk layer is substantially free of pinhole defects.

17. The solar cell of claim 14, wherein the formed bulk layer is substantially free of pinhole defects.

18. The solar cell of claim 7, wherein the solar cell has a fill factor of at least 0.40.

19. The solar cell of claim 14, wherein the solar cell has a fill factor of at least 0.40.

* * * * *